(12) United States Patent
Jecko et al.

(10) Patent No.: US 7,388,557 B2
(45) Date of Patent: Jun. 17, 2008

(54) ANTENNA WHICH IS MADE FROM A PHOTONIC BAND GAP (PBG) MATERIAL AND WHICH COMPRISES A LATERAL WALL SURROUNDING AN AXIS

(75) Inventors: Bernard Jecko, Rilhac Rancon (FR); Laure Freytag, Lasserre (FR); Elisa Pointereau, Limoges (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 0 days.

(21) Appl. No.: 11/579,317

(22) PCT Filed: Apr. 29, 2005

(86) PCT No.: PCT/FR2005/001087

§ 371 (c)(1),
(2), (4) Date: Feb. 1, 2007

(87) PCT Pub. No.: WO2005/124927

PCT Pub. Date: Dec. 29, 2005

(65) Prior Publication Data

US 2007/0236405 A1 Oct. 11, 2007

(30) Foreign Application Priority Data

May 19, 2004 (FR) .................................. 04 05485

(51) Int. Cl.
*H01Q 1/42* (2006.01)
(52) U.S. Cl. ...................... 343/872; 343/909; 343/754; 343/779

(58) Field of Classification Search ........ 343/754–756, 343/709, 702, 779, 872, 786, 909
See application file for complete search history.

(56) References Cited

U.S. PATENT DOCUMENTS

| 5,689,275 | A  | * | 11/1997 | Moore et al. ............... 343/786 |
| 6,425,560 | B1 | * | 7/2002  | Dembowiak et al. .... 248/206.5 |
| 6,473,048 | B1 | * | 10/2002 | Diaz .......................... 343/753 |
| 7,233,299 | B2 | * | 6/2007  | Thevenot et al. ........... 343/912 |
| 2007/0080891 | A1 | * | 4/2007 | De Lustrac et al. ........ 343/909 |

FOREIGN PATENT DOCUMENTS

| FR | 2 709 878 | 3/1995 |
| FR | 2 801 428 | 5/2001 |
| WO | 00/79643 | 12/2000 |

* cited by examiner

*Primary Examiner*—Douglas W. Owens
*Assistant Examiner*—Chuc Tran
(74) *Attorney, Agent, or Firm*—Young & Thompson

(57) ABSTRACT

A antenna made from a photonic band-gap (PBG) material, includes: a lateral wall (4) which is made from a PBG material and which completely surrounds a central axis (6), the wall being disposed at a distance from the central axis such as to form a central resonant cavity; and at least one radiating element (34) which is placed inside the cavity. Each radiating element is positioned inside the cavity in order to excite an electromagnetic field parallel to the central axis and the radiating element(s) can excite the modes of the central cavity having a radial resonance more strongly than the other modes of the cavity.

20 Claims, 5 Drawing Sheets

ANTENNA WHICH IS MADE FROM A PHOTONIC BAND GAP (PBG) MATERIAL AND WHICH COMPRISES A LATERAL WALL SURROUNDING AN AXIS

The present invention relates to an antenna of photonic band gap (PBG) material with a side wall surrounding an axis.

Known PBG material antennas comprise:
a side wall of PBG material completely surrounding a central axis and spaced apart from said central axis to leave a resonant central cavity suitable for creating at least one narrow frequency passband within a broad frequency stop band of the PBG material; and
at least one radiating element placed inside the cavity, suitable for exciting an electromagnetic field for radiating or receiving electromagnetic radiation at a given operating frequency situated within the narrow frequency passband.

For example, French patent application FR 99/14521 proposes making a PBG material antenna with a side wall formed by coaxial cylinders surrounding the probe. In that patent application, the preferred embodiments described use a plate or patch probe. Nevertheless, the gain of such antennas fitted with a patch probe is not very high.

The invention seeks to improve the gain of such antennas.

The invention thus provides such an antenna made of PBG material, in which:
the or each radiating element is positioned inside the cavity so as to excite an electromagnetic field parallel to the central axis; and
at least one radiating element is suitable for exciting the modes of the central cavity that present radial resonance more strongly than the other modes of the central cavity.

It has been found that it is possible to increase the gain of such PBG material antennas by positioning and selecting the or each probe in a manner described above. In this specification, the term "radial resonance" designates resonances that become established in a plane perpendicular to the central axis. These modes of the cavity presenting radial resonance are also known under the terms "TE modes" when they are excited by a magnetic field $H_z$, or "TM modes" when they are excited by an electric field $E_z$.

Embodiments of the PBG material antenna may include one or more of the following characteristics:
the or each radiating element is suitable for exciting only those modes of the central cavity that present radial resonance;
at least one of the radiating elements forms an individual electric dipole parallel to or coinciding with the central axis;
at least one of the radiating elements forms an individual magnetic dipole parallel to or coinciding with the central axis;
the antenna includes at least one probe placed inside the cavity, the or each probe having one or more of said radiating elements;
at least one conductor plane that is perpendicular to the central axis, and the or each probe is supported by the or one of the conductor planes;
at least two probes are disposed relative to one another in such a manner that one of the probes is the electric image of the other symmetrically about the conductor plane;
a central core of conductive material is aligned on the central axis, and the or each probe is supported by said central core;
an electrical conductor feeds the or each probe and passes inside the central core;
a plurality of radiating elements are uniformly distributed around the periphery of the central core;
a support holds the or each probe in place in the cavity, said support being made of a material of relative permittivity that is equal to the relative permittivity of the material filling the cavity to within ±3;
the or each probe is selected from a set comprising an electric dipole and a wire-and-plate probe:
a plurality of radiating elements are disposed at different heights along the central axis;
a plurality of radiating elements are disposed at the same height along the central axis;
the central cavity presents two open ends through which the central axis passes, and the antenna includes at least one closure cap for closing one of the open ends, the closure cap being made of a dielectric material of relative permittivity lying in the range 1 to 3;
the side wall of PBG material comprises a structure of metal PBG material;
the radiating elements are adapted to work at the same operating frequency, and the or each radiating element forming an individual electric dipole is excited in phase quadrature relative to the or each radiating element forming an individual magnetic dipole so as to create circular polarization;
the cavity is in the form of a barrel, the axis of symmetry of the barrel coinciding with the central axis;
the cavity is a circular cylinder of axis of symmetry that coincides with the central axis; and
the central cavity presents two open ends through which the central axis passes, and the central core comprises two flared portions connected together by a narrower portion, each of the flared portions partially closing a respective one of the open ends.

The invention can be better understood on reading the following description given purely by way of example and made with reference to the drawings, in which.

Figure 7:
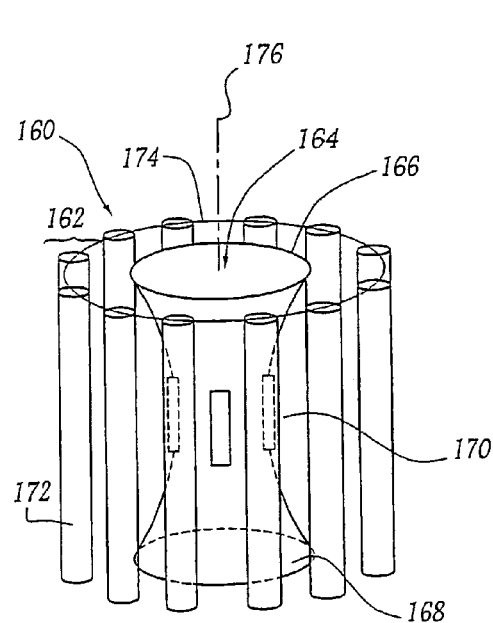
Figure 8:
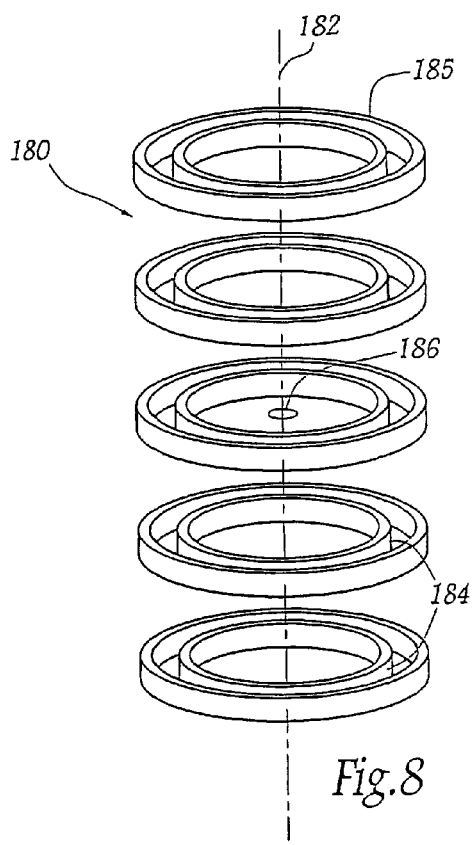
Figure 9:
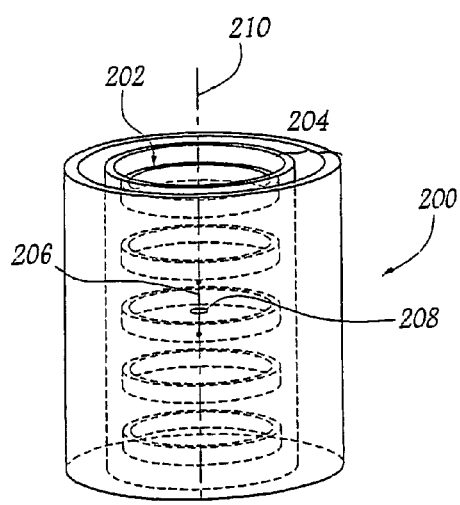
Figure 10:
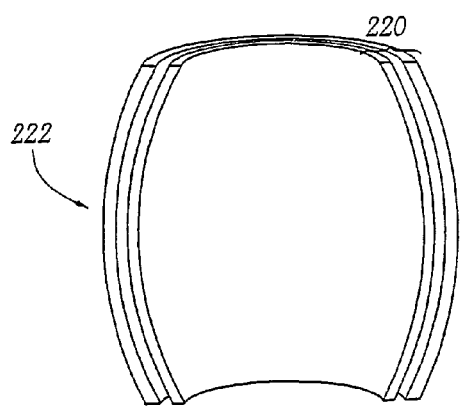

FIGS. 7, 8, and 9 are simplified perspective views respectively of fifth, sixth, and seventh embodiments of an antenna made of PBG material; and FIG. 10 is a simplified section and perspective view of an eighth embodiment of an antenna made of PBG material.

Figure 1:
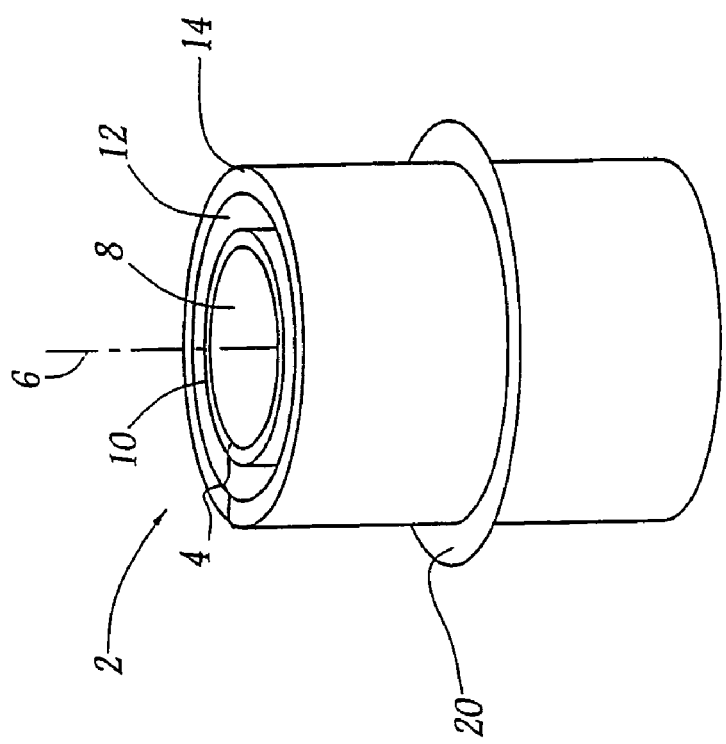
FIG. 1 is a diagrammatic and fragmentary perspective view of a first embodiment of an antenna made of PBG material.

FIG. 1 shows an antenna made of PBG material given overall reference 2. The antenna 2 includes a vertical side wall 4 completely surrounding a central axis 6 and spaced apart from said central axis to leave a resonant central cavity 8.

The wall 4 is a circular cylinder symmetrical about the axis 6. The wall 4 is made of one-dimensional PBG material presenting radial periodicity. For example, the PBG material comprises in succession an inner cylinder 10, an intermediate cylinder 12, and an outer cylinder 14. The inner cylinder 10 is made of a dielectric material having relative permittivity $\epsilon_{r1}$ and a constant diameter $d_1$. The inside diameter of the cylinder 10 corresponds to the outside diameter of the cavity 8. By way of example, $\epsilon_{r1}$ is equal to nine in the description below.

The cylinder 12 is made of a material having relative permittivity $\epsilon_{r2}$ and is of constant thickness $d_2$. The relative permittivity $\epsilon_{r2}$ is different from $\epsilon_{r1}$. By way of example, in this case the material is air and $\epsilon_{r2}$ is equal to one.

The cylinder 14 is made of a material having relatively permittivity equal to that of the cylinder 10 and it is of constant thickness $d_1$.

The cavity 8 is filled with the same material as the cylinder 12 so as to correspond to a radial periodicity defect of the PBG material.

The diameter $d_c$ of the cavity 8 is selected so that it is a resonant cavity suitable for creating at least one narrow frequency passband within a broad frequency stop band of the PBG material forming the wall 4. For this purpose, the diameter $d_c$ of the cavity 8 is selected as a function of the operating frequency desired for the antenna 2 using the following relationship:

$$d_c = \alpha \cdot \lambda_{g2} = \alpha / (f_T \cdot \sqrt{\epsilon_{r2}}) \qquad (1)$$

where:

$\lambda_{g2}$ is the wavelength of the operating frequency in the material filling the cavity 8;

$\alpha$ is a constant coefficient selected to lie in the range 0.75 to 0.85, and is preferably equal to 0.8;

$c$ is the speed of light; and $f_T$ is the operating frequency desired for the antenna 2.

The value of the coefficient $\alpha$ is determined experimentally so as to create a narrow frequency passband within a broad frequency stop band of the PBG material.

The thicknesses $d_1$ and $d_2$ are also selected as a function of the desired operating frequency, using the following relationships:

$$d_1 = \frac{\lambda_{g1}}{4} = c / (4 \cdot f_T \sqrt{\epsilon_{r1}}) \qquad (2)$$

$$d_2 = \frac{\lambda_{g2}}{4} = c / (4 \cdot f_T \sqrt{\epsilon_{r2}}) \qquad (3)$$

where $\lambda_{g1}$ and $\lambda_{g2}$ are respectively the wavelengths corresponding to the operating frequency in the materials of the cylinders 10 and 12.

The transmission coefficient of such an antenna made of PBG material is similar to that shown in FIG. 7 of French patent application FR 99/14521.

By way of example, in the description below, the desired working frequency $f_T$ is equal to 5.5 gigahertz (GHz), $d_c$ is equal to 43 millimeters (mm), $d_1$ is equal to 10.5 mm, and $d_2$ is equal to 3.5 mm.

The height H of the wall 4 in the direction parallel to the axis 6 is selected to correspond to a good compromise between firstly the gain and secondly the width of the passband of the antenna 2. In general, the greater the height the greater the gain, and also the narrower the width of the passband of the antenna 2. In this example, the height of the antenna 2 is selected to be equal to 214 mm.

In this embodiment, the antenna 2 has a conductor plane 20 extending perpendicularly to the axis 6 and intersecting the antenna 2 at half-height. In this example, the conductor plane is a cylindrical plate of thickness that is small compared to its width. This plate is centered on the axis 6 and its diameter is greater than the outside diameter of the cylinder 14. For example the diameter of the plane 20 is 95 mm.

Figure 2:
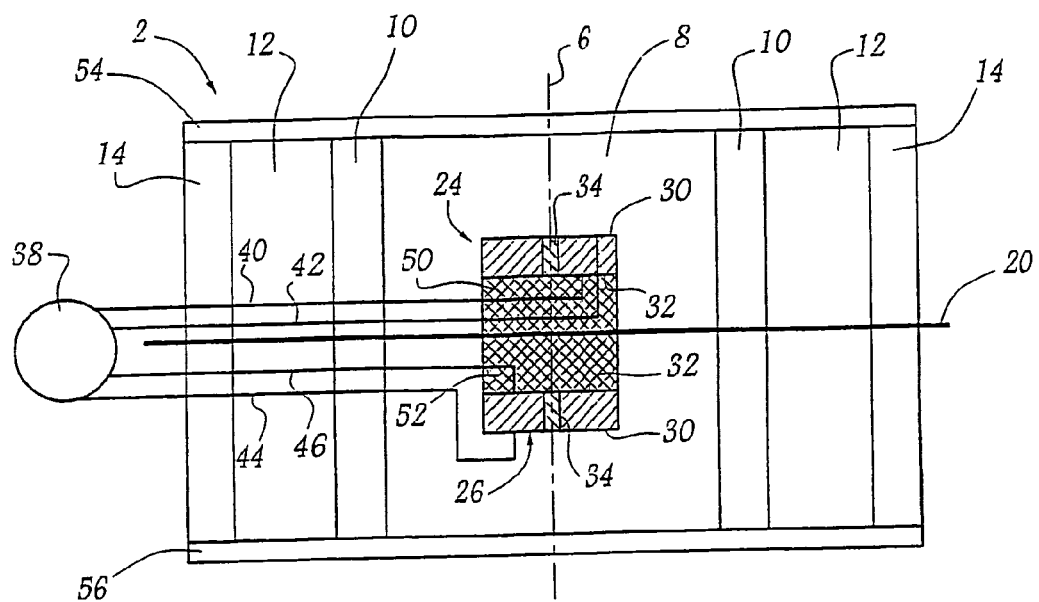
FIG. 2 is a section view of the FIG. 1 antenna.

In FIG. 2, the elements of the antenna 2 described above with reference to FIG. 1 are given the same references.

Inside the cavity 8, there are placed two identical wire-and-plate probes 24, 26. These probes 24, 26 are made in accordance with the teaching of French patent application FR 93/10597. It is merely recalled at this point that each wire-and-plate probe comprises two parallel conductor plates 30, 32 and a radiating element 34 extending perpendicularly to the conductor plates and electrically connected to both conductor plates.

Each plate 30, 32 is circular and presents a diameter of 13 mm. The length of the radiating element 34 that extends between the plates 30 and 32 is a function of the desired operating frequency $f_T$. In this case the length is selected to be equal to 0.8 mm.

The plates 30 and 32 are connected to an electrical generator/receiver 38 such as a voltage or current generator/receiver. To this end, electrical conductors 40, 42 connect the plates 30 and 32 of the probe 24 respectively to respective inputs of the generator/receiver 38. Similarly, electrical conductors 44, 46 connect the plates 30 and 32 of the probe 26 respectively to respective inputs of the generator/receiver 38.

These conductors 40, 42, 44, and 46 are secured to the surface of the plane 20 or they are incorporated in the thickness of said plane 20 so as to avoid disturbing the electric field radiated by the probes 24 and 26.

The radiating element of a wire-and-plate probe is equivalent to an individual electric dipole of axis that coincides with that of the radiating element. Under such circumstances, in this example the probes 24 and 26 are positioned inside the cavity 8 so that the axes of the radiating elements 34 are in alignment with the axis 6. Thus, each of the probes 24, 26 forms an individual electric dipole of axis that coincides with the axis 6. Under such conditions, each probe 24 and 26 excites solely an electric field $E_z$ parallel to the axis 6. The advantage of such a characteristic appears below in the description of the operation of the antenna.

The probes 24 and 26 are disposed on either side of the plane 20 so that each of these probes is the electrical image of the other symmetrically about the plane 20. Thus, the plane 20 does not introduce any asymmetry into the radiation pattern of the antenna 2.

The probes 24 and 26 are held in place inside the cavity 8 by the plane 20. More precisely, in this example, each probe 24, 26 is secured to the plane 20 via a respective spacer 50, 52. In order to avoid disturbing the distribution of the electric fields inside the cavity 8, the spacers 50 and 52 are made of a material having relative permittivity equal to that of the material filling the cavity 8, to within ±3. In this example, the material used for the spacers is a Rhoacell foam having relative permittivity equal to 1.

By way of example, these spacers have a thickness of 5 mm in order to offset each of the probes 24, 26 by 5 mm away from the surface of the plane 20. These spacers serve to increase the gain of the antenna.

In order to prevent dirt penetrating into the cavity 8 or into the cylinder 12, the antenna 2 includes at each of the two open ends of the cavity 8 a circular closure cap 54, 56. The diameter of each cap 24 or 56 is selected to be great enough to close both the open end of the cavity 8 and also the end of the cylinder 12. The caps 54 and 56 can thus have the same diameter as the outside diameter of the cylinder 14, for example. In order to avoid disturbing the distribution of the electromagnetic fields within the cavity 8, these caps are made of a dielectric material having relative permittivity lying in the range 1 to 3.

When the antenna 2 is in operation, the probes 24 and 26 excite the $E_z$ field only. Consequently, only the TM modes of the cavity are excited. The other modes of the cavity are not excited, which explains its better performance.

By way of example, in the particular configuration of the antenna 2 as described above, the following simulated performance has been obtained:

the maximum intrinsic gain of the antenna is about 9.4 decibels (dB);

the −3 dB radiated passband lies in the range 5.4 GHz to 5.8 GHz; and the gain-bandwidth product of the antenna is equal to 62.

The gain-bandwidth product is obtained by multiplying the linear maximum intrinsic gain of the antenna (i.e. not expressed in decibels) by the passband expressed as a percentage. The passband is expressed as a percentage by dividing the width of the passband by its center frequency, and then multiplying the result by one hundred.

The radiation pattern of the antenna 2 is symmetrical about the plane 20 and also presents circular symmetry about the axis 6. This is due mainly to the positioning of the probes 24 and 26 inside the cavity 8.

The intrinsic gain value of the antenna 2 is better than that which would be obtained with an antenna that is similar but fitted with a patch probe disposed parallel to the plane 20, or indeed a wire-and-plate probe, but having the axis of its radiating element not in alignment on the axis 6. The gain improvement that is obtained can be explained by the selection of a particular type of probe and by the particular position of said probe inside the cavity 8. It has been found that there exist two distinct modes of operation within the antenna 2 referred to below respectively as the guided mode of operation and as the radiating mode of operation. In the guided mode of operation, energy is guided along the axis 6 and is not radiated through the wall 4. The guided mode of operation is not useful while the antenna 2 is in use, and thus corresponds to energy that is lost. In contrast, in the radiating mode of operation, energy is radiated through the wall 4 and it is not guided along the axis 6. The radiated mode of operation corresponds to modes in which the cavity 8 presents radial resonance, i.e. the TE and TM modes.

Thus, by preferentially exciting those modes of the cavity that present radial resonance, the performance of the antenna is improved, and in particular its gain.

Figure 3:
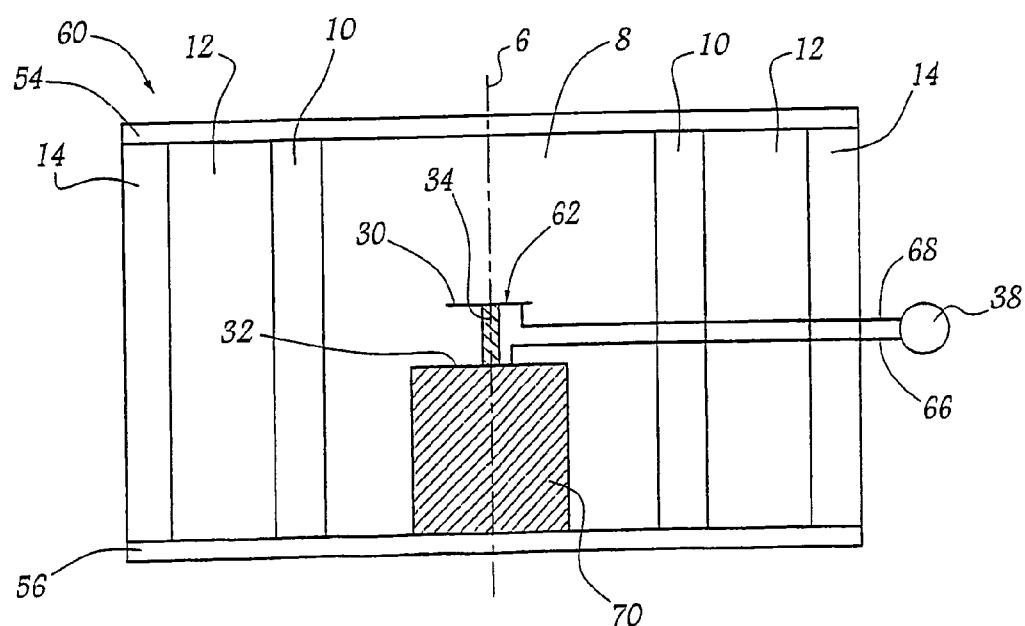
FIG. 3 is a section view of a second embodiment of an antenna made of PBG material.

FIG. 3 shows another antenna 60 made of PBG material. In FIG. 3, elements described above with reference to FIG. 2 are given the same references and are not described again.

The antenna 60 differs from the antenna 2 essentially by the fact that it has only one wire-and-plate probe 62, and by the way in which said probe is secured inside the cavity 8. The probe 62 differs from the probes 24 or 26 only in its dimensions. In this example, the plates 30 and 32 have a diameter of 9 mm and the length of the radiating element 34 is 5 mm. Like the probes 24 and 26, the radiating element 34 of the probe 62 is in alignment on the axis 6 and it is located substantially halfway up the cavity 8. Each plate 30, 32 is connected to the generator/receiver 38 via a respective electrical conductor 66, 68. Nevertheless, unlike the conductors 40 and 42, the conductors 66 and 68 extend vertically along the axis 6, each being constituted, for example, by a respective coaxial cable so as to avoid disturbing the electromagnetic fields inside the cavity 8.

In this example, the probe 62 is placed or secured to a support 70 of dielectric material. In this example, the support 70 is, for example, secured to the cap 56 in such a manner as to hold the probe 62 in place in the middle of the cavity 8. In a manner similar to that described for the spacers 50 and 52, the support 70 is made of a dielectric material having relative permittivity that is equal to that of the dielectric material filling the cavity 8 to within ±3. By way of example, the material of the support 70 is Rhoacell foam.

The electrical conductors 66 and 68 pass through the support 70.

As for the antenna 2, the probe 62 excites only the TM modes of the cavity 8. The improvement in the performance of the antenna 60 is thus explained in the same manner as that of the antenna 2.

Figure 4:
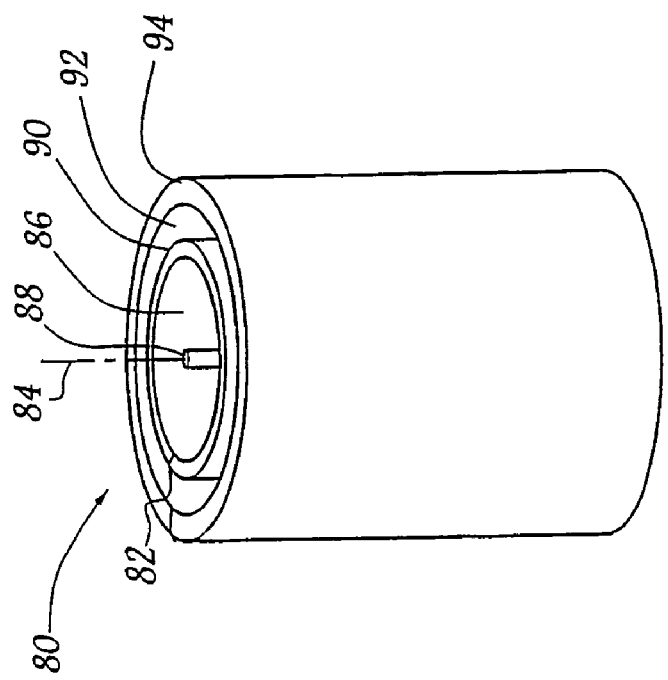
FIG. 4 is a diagrammatic and fragmentary perspective view of a third embodiment of an antenna made of PBG material.

FIG. 4 shows an antenna 80 comprising a side wall 82 completely surrounding a central axis 84 and spaced apart from said central axis by a resonant cavity 86. The antenna 80 has a cylindrical central core 88 of conductive material that extends along the axis 84.

The wall 82 is made of a one-dimensional PBG material which, like the wall 4 of the antenna 2, is formed by juxtaposing three vertical cylinders 90, 92, and 94. The cylinder 90 is the inner cylinder of inside diameter defining the outside diameter $d_c$ of the cavity 86. When the antenna has a central core, relationship (1) is replaced by the following relationship:

$$d_c = \lambda_{g2} = d_{ac} = c(f_T \cdot \sqrt{\epsilon_{r2}}) + d_{ac} \qquad (4)$$

where $d_{ac}$ is the diameter of the central core 88.

The thicknesses of the cylinders 90, 92, and 94 are calculated using above relationships (2) and (3).

Like the antenna 2, the cavity 86 as constructed in this way creates a narrow frequency passband within a broad frequency stop band of the PBG material.

The height of the wall 82 is selected as a function of a compromise between firstly the gain and secondly the width of the passband.

In this example, the core 88 is a hollow cylinder of conductive material having an outside diameter of 4 mm.

Figure 5A:
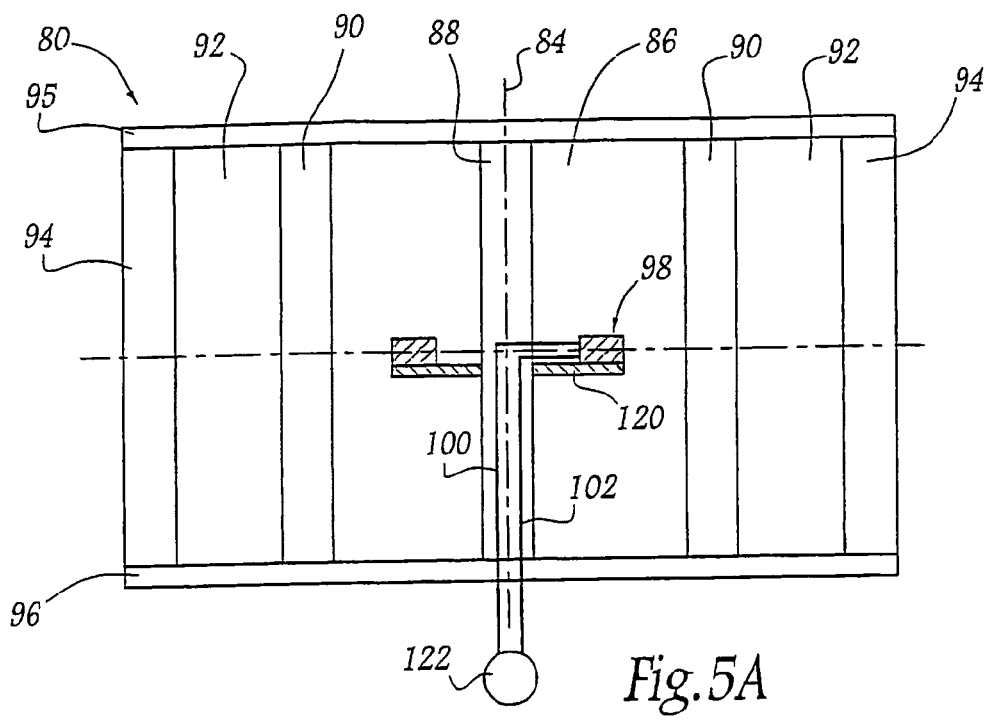
FIG. 5A is a section view of the FIG. 4 antenna.

As described in greater detail below with reference to FIG. 5A, the core 88 serves to hold a wire-and-plate probe 98 in position inside the cavity 86. The core 88 is also used as shielding for two electrical conductors 100 and 102 powering the probe 98.

Figure 5B:
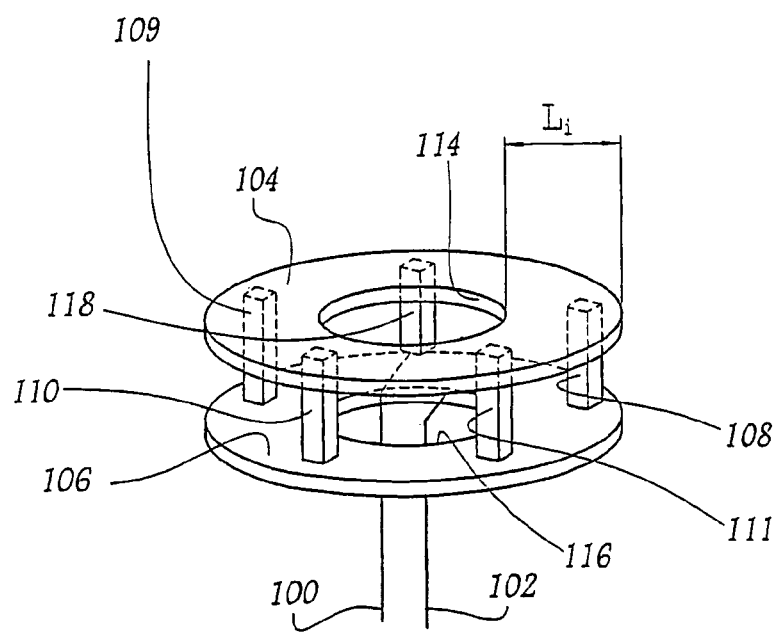
FIG. 5B is a diagrammatic perspective view of a probe used in the FIG. 4 antenna.

FIG. 5B shows the probe 98 in greater detail. This probe comprises two parallel circular conductive plates 104 and 106 electrically interconnected by four radiating elements 108 to 111 that extend perpendicularly to the plates 104 and 106. By way of example, the radiating elements are square in section. In this example their sections are 1 square millimeter ($mm^2$). The height of each of the radiating elements is 5 mm.

Each of the plates 104 and 106 has a central orifice 114 or 116 suitable for receiving the core 88. The radiating elements 108 to 111 are uniformly distributed around these orifices 114 and 116. In this example, the width $L_t$ between the central orifice 114 or 116 and the outer periphery of the plates 104 or 106 is 5.5 mm. The diameter of each central orifice is 9 mm.

The probe 98 also comprises a conductor rod 118 extending parallel to the radiating elements 108 to 111 between the plates 104 and 106. This rod 118 is secured via one of its end to the plate 104, while its other end is free. This rod is thus electrically connected to the plate 104 while being electrically isolated from the plate 106. The free end of the rod 118 is connected to the conductor 100. The conductor 102 is electrically connected to the plate 106.

The probe 98 is held in place inside the cavity 86 by the core 88 halfway up the wall 82. More precisely, the core 88 passes through the orifices 114 and 116, and the probe 98 is secured to said core 88 by a ring 120 of dielectric material. The relative permittivity of the material constituting the ring 120 is equal or close to the relative permittivity of the material filling the cavity 86. For example, in this example the material may be Rhoacell (registered trademark) foam.

The ends of the conductors 100 and 102 that are connected to the probe 98 extend through the ring 120 in a plane perpendicular to the axis 84 so as to avoid disturbing the electromagnetic fields inside the cavity 86. Intermediate portions of the conductors 100 and 102 are received inside the core 88 connecting their ends to an electrical energy generator/receiver 122 identical to the generator/receiver 38.

Since the conductors 101 and 102 are separated from the cavity 86 by a conductive material, their electromagnetic radiation does not interfere with that from the probe 98.

Because the radiating elements of the probe 98 are uniformly distributed around the axis 84, the radiation pattern of the antenna 80 presents firstly symmetry about a plane perpendicular to the axis 84 and containing the middles of said radiating elements, and secondly circular symmetry about the axis 84.

The probe 98 is equivalent to four individual electric dipoles, and it excites only the TM modes of the cavity 8.

Figure 6A:
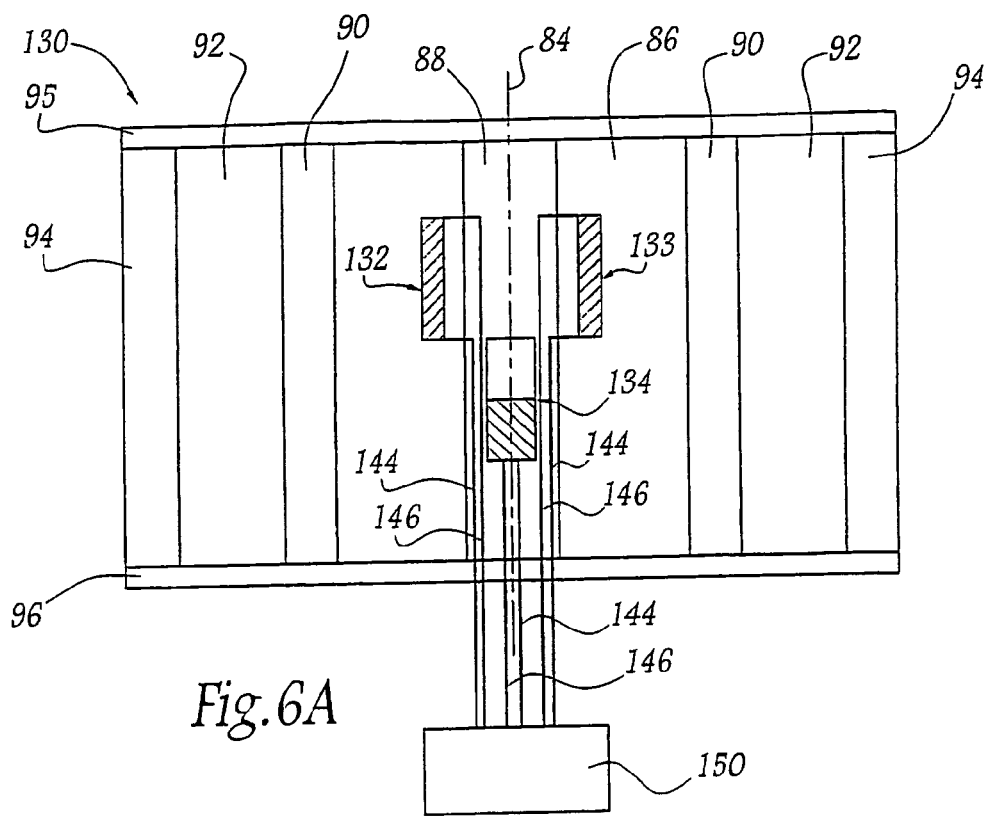
FIG. 6A is a section view of a fourth embodiment of an antenna made of PBG material.

Above, the antennas 2, 60, and 80 are described for the particular circumstance in which they have wire-and-plate probes. FIG. 6A shows an antenna 130 of structure identical to that of the antenna 80, with the exception of the probe 98 being replaced by four identical electric dipoles. The elements of the antenna 130 that are described above with reference to FIG. 5A are given the same references in FIG. 6A and are not described again.

Figure 6B:
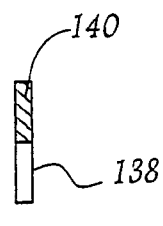
FIGS. 6B and 6C are diagrammatic views respectively from in front and from behind of a probe used in the FIG. 6A antenna.
Figure 6C:
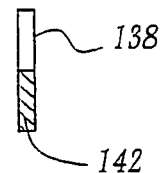

In this example, in order to simplify the illustration, only three printed dipoles 132 to 134 are shown out of the four that the antenna 130 comprises. The rear and front faces of one of these dipoles are shown in greater detail respectively in FIGS. 6B and 6C.

Each printed dipole comprises a rectangular dielectric substrate 138. In this example the substrate measures 8.1 mm in width and 42 mm in length. The rear face has a strip 140 of conductor material occupying the entire top portion of the rear face. In this example the strip 140 has a length of 22 mm starting from the top end of the substrate. Conversely, on the front face, a strip 142 of conductor material occupies the entire bottom portion of the front face. This strip 142 also measures 22 mm in length starting from the bottom end of the substrate.

These strips 140 and 142 are connected via respective electrical conductors 144 and 146 to an electrical energy generator/receiver 150.

The dipoles are held in place inside the cavity 86 by the core 88. More precisely, each dipole is spaced apart from the outside surface of the core 88 by an airgap presenting a thickness of 0.81 mm in order to improve the gain of the antenna. In this example, the electrical conductors 144 and 146 are selected to be sufficiently rigid for their ends that are connected to the printed dipoles to serve as elements for securing the dipoles to the core 88 without having resource to a spacer or any other support.

In this example, the printed dipoles are placed at different heights along the core 88, thus serving to spread out the field $E_z$ that they generate along the axis 86. This improves the performance of the antenna and in particular its gain. In this example, the dipoles 132 and 133 are disposed immediately above a midplane perpendicular to the axis 84 and intersecting the side wall of PBG material at half-height. The printed dipoles 132 and 133 are disposed relative to one another in such a manner that one of these dipoles constitutes the image of the other symmetrically about the axis 84. Similarly, the dipole 134 and the dipole that is not shown in FIG. 6A are disposed immediately under the midplane so as to be images of each other about the axis of symmetry 84.

A printed dipole constitutes a radiating element equivalent to an individual electric dipole. In this example, the printed dipoles are vertical so that the axis of the corresponding individual electric dipole is parallel to the axis 86. Thus, these dipoles excite only the TM modes of the cavity. The improvement in performance obtained using printed dipoles is similar to that obtained when using wire-and-plate probes with radiating elements that are parallel to the central axis of the antenna.

The above-described antennas all have a side wall made of dielectric PBG material. FIG. 7A shows an antenna 160 in which the side wall of dielectric PBG material is replaced by a side wall 162 of metal PBG material. In addition, in the antenna 160, the cylindrical central core is replaced by a central core 164 having two flared ends 166 and 168 connected to each other via a central portion 170 of narrower section.

Unlike a dielectric PBG material, a metal PBG material has a distribution of conductive material that presents spatial periodicity in at least one direction. In this example, the wall 162 is formed by a succession of vertical metal bars 172 that are uniformly distributed along the periphery of a horizontal circle 174. The metal bars 172 are separated from one another by a material presenting electrical conductivity that is different, e.g. by air.

By way of example, the dimensions of the wall 162 are determined using relationships (2), (3), and (4).

The wall 162 presents an axis 176 of circular symmetry that coincides with the central axis of the antenna. The PBG material of the wall 162 does not present any periodicity in the direction of the axis 176. Under such circumstances, the wall 162 modifies only the vertical polarization of a probe, i.e. that created by one or more probes equivalent to an individual electric dipole parallel to or coinciding with the axis 176.

In this example, four vertical printed dipoles are secured around the central portion 170 halfway up the wall 162. In order to obtain a radiation pattern that is symmetrical, these dipoles are distributed uniformly along the outer periphery of the central portion 170.

As in the above-described embodiments, the core 164 is made of a hollow conductive material. The flared ends 166 and 168 partially obstruct the open ends of the resonant cavity. This configuration of the central core increases antenna gain by about 10% compared with that of an antenna in which the side wall and the central core are cylindrical.

The use of a metal PBG material for making the side wall presents several advantages, in particular that of improving the performance of the antenna compared with an identical antenna formed with a dielectric PBG material. A metal PBG material is also less expensive than a dielectric PBG material.

FIG. 8 shows an antenna 180 in which the side wall is made using another metal PBG material presenting one-dimensional periodicity in a direction parallel to a central axis 180 of the antenna. More precisely, the side wall is formed by a vertical stack of rings 184 of conductive material centered on the axis 182. These rings are spaced apart from one another at a constant pitch formed in a material of different conductivity, such as air, for example. Metal PBG materials presenting one-dimensional periodicity in the vertical direction, as in this example, modify horizontal polarization only, i.e. that created by a magnetic field $H_z$ parallel to the axis 182.

A probe 186 suitable for exciting the magnetic field $H_z$ is placed inside the resonant cavity of the antenna 180. In order to excite the magnetic field $H_z$ only, this probe 186 comprises solely radiating elements equivalent to an individual magnetic dipole of axis coinciding with or parallel to the axis 182. By way of example, the probe 186 is a current loop placed in a plane perpendicular to the axis 182, halfway up the antenna 180, and the axis of revolution of the loop coincides with the axis 182. Like the probes described above, this probe 186 excites only those modes of the cavity that present radial resonance, such that the antenna 180 essentially presents a radiating mode of operation and not a guided mode of operation. Nevertheless, unlike probes equivalent to individual electric dipoles, the modes of the cavity that are excited by the probe 186 are the TE modes.

The various techniques described with reference to FIGS. 1 to 7 for holding a probe in place inside the resonance cavity can be used for holding the probe 186 in place in the cavity. In this example, the means for holding the probe 186 in the cavity are not shown in order to simplify FIG. 8.

FIG. 9 shows an antenna 200 combining the characteristics of the antennas 2 and 180. More precisely, the side wall of the antenna 200 is made up by juxtaposing a metal PBG material 202 and a dielectric PBG material 204. By way of example, the metal PBG material 202 is identical to that of the antenna 180 while the dielectric PBG material 204 is identical to that of the antenna 2.

Inside the resonant cavity there is placed a probe comprising two radiating elements 206 and 208. The radiating element 206 is equivalent to an individual electric dipole of axis that coincides with a central axis 210 of the antenna 200. The radiating element 208 is equivalent to an individual magnetic dipole of axis that also coincides with the central axis of the antenna. Under such conditions, the radiating element 206 excites only the electric field $E_z$, while the radiating element 208 excites only the magnetic field $H_z$. It should also be observed that the presence of the metal PBG material 202 does not modify the vertical polarization generated by the radiating element 206 since it presents one-dimensional periodicity only in a direction parallel to the central axis 210.

The antenna 200 thus presents both vertical polarization and horizontal polarization. In addition, in this example in order to create circular polarization, the radiating element 206 is excited in phase quadrature relative to the radiating element 208.

These radiating elements 206 and 208 are held in place inside the resonant cavity by relying on the teaching of one of the above-described embodiments. To simplify the illustration of FIG. 9, the means for holding them in place are not shown.

FIG. 10 is a vertical section and perspective view of a side wall 220 of an antenna 222. This side wall is barrel-shaped. By way of example, the wall 220 is made using a dielectric PBG material. Such a shape for the side wall creates a barrel-shaped central cavity and increases the gain of the antenna by about 10% relative to an antenna having its side wall formed by cylinders of constant section.

One or more of the above-described probes are held in place inside the barrel-shaped central cavity using the above-described teaching. These probes and their structures are therefore not shown in FIG. 10 in order to simplify the illustration.

Numerous other embodiments of a PBG material antenna exist. For example, the wire-and-plate probes, the electric dipoles, or the magnetic dipoles could replace one another in the embodiments described. It is also possible, as in the antenna 200, to use these probes together within a single resonant cavity. The probes are described herein as being either wire-and-plate probes or else optionally printed electric dipoles, or indeed current loops. Nevertheless, any probe in which each radiating element is equivalent either to an individual electric dipole or to an individual magnetic dipole can be used instead of and replacing any of the above-described probes by being positioned in the resonant cavity in such a manner that the radiating elements excite an electromagnetic field parallel to the central axis.

In the above-described embodiments, the radiating elements are uniformly distributed around the central axis so as to obtain a radiation pattern that is omnidirectional in a plane perpendicular to the central axis. Nevertheless, in a variant, the radiating elements are disposed in larger numbers on one side of a plane containing the central axis so as to establish asymmetry in the radiating pattern.

In the embodiment of FIG. 2, the wire-and-plate probes have two plates that are distinct from the conductor plane 20. In a variant, the plate 32 of the probe 24 and/or 26 could be omitted, and the conductor element 34 could be connected directly at one of its ends to the conductor plane 20. The spacers 50 and 52 should also be omitted in this variant.

The central core is described for the above embodiments as being made of a conductive material. However, in a variant, the central core could be made of a PBG material. The central core is also described above as being circularly cylindrical. Nevertheless, in a variant, the section of the central core could be a parallelogram.

In another embodiment, the PBG material of the side wall is a PBG material presenting two or three dimensions, such as those disclosed in French patent application FR 99/14521.

The above description is not restricted to side walls that are cylindrical or barrel-shaped, but applies to any side wall of PBG material that completely surrounds a central axis and that is spaced apart from said central axis so as to provide a resonant central cavity, said cavity presenting at least one plane of symmetry containing the central axis.

The invention claimed is:

1. An antenna made of photonic band gap material, comprising:
 a side wall of PBG material completely surrounding a central axis and spaced apart from said central axis to leave a resonant central cavity suitable for creating at least one narrow frequency passband within a broad frequency stop band of the PBG material; and
 at least one radiating element placed inside the cavity, suitable for exciting an electromagnetic field for radiating or receiving electromagnetic radiation at a given operating frequency situated within the narrow frequency passband;
 wherein:
 the radiating element is positioned inside the cavity so as to excite an electromagnetic field parallel to the central axis; and said at least one radiating element is suitable for exciting the modes of the central cavity that present radial resonance more strongly than the other modes of the central cavity.

2. An antenna according to claim 1, wherein the radiating element is suitable for exciting only those modes of the central cavity that present radial resonance.

3. An antenna according to claim 1, wherein at least one of the radiating elements forms an individual electric dipole parallel to or coinciding with the central axis.

4. An antenna according to claim 3, wherein at least one of the radiating elements forms an individual magnetic dipole parallel to or coinciding with the central axis, and wherein the radiating elements are adapted to work at the same operating frequency, and wherein the radiating element forming an individual electric dipole is excited in phase quadrature relative to the radiating element forming an individual magnetic dipole so as to create circular polarization.

5. An antenna according to claim 1, wherein at least one of the radiating elements forms an individual magnetic dipole parallel to or coinciding with the central axis.

6. An antenna according to claim 1, wherein the antenna includes at least one probe placed inside the cavity, the probe having one or more of said radiating elements.

7. An antenna according to claim 6, including at least one conductor plane perpendicular to the central axis, and wherein the probe is supported by the or one of the conductor planes.

8. An antenna according to claim 7, including at least two probes disposed relative to one another in such a manner that one of the probes is the electric image of the other symmetrically about the conductor plane.

9. An antenna according to claim 6, including a central core of conductive material aligned on the central axis, and wherein the probe is supported by said central core.

10. An antenna according to claim 9, including an electrical conductor feeding the probe and passing inside the central core.

11. An antenna according to claim 9, including a plurality of radiating elements uniformly distributed around the periphery of the central core.

12. An antenna according to claim 6, including a support for holding the probe in place in the cavity, said support being made of a material of relative permittivity that is equal to the relative permittivity of the material filling the cavity to within ±3.

13. An antenna according to claim 6, wherein the probe is selected from a set comprising an electric dipole and a wire-and-plate probe.

14. An antenna according to claim 1, including a plurality of radiating elements disposed at different heights along the central axis.

15. An antenna according to claim 1, including a plurality of radiating elements disposed at the same height along the central axis.

16. An antenna according to claim 1, wherein the central cavity presents two open ends through which the central axis passes, and wherein the antenna includes at least one closure cap for closing one of the open ends, the closure cap being made of a dielectric material of relative permittivity lying in the range 1 to 3.

17. An antenna according to claim 1, wherein the side wall of PBG material comprises a structure of metal PBG material.

18. An antenna according to claim 1, wherein the cavity is in the form of a barrel, the axis of symmetry of the barrel coinciding with the central axis.

19. An antenna according to claim 1, wherein the cavity is a circular cylinder of axis of symmetry that coincides with the central axis.

20. An antenna according to claim 1, wherein the central cavity presents two open ends through which the central axis passes, and wherein the central core comprises two flared portions connected together by a narrower portion, each of the flared portions partially closing a respective one of the open ends.

* * * * *